(12) United States Patent
Hibino et al.

(10) Patent No.: US 7,142,833 B2
(45) Date of Patent: Nov. 28, 2006

(54) MATCHING UNIT

(75) Inventors: Yasuhiro Hibino, Gifu (JP); Ryuichi Kamimoto, Nisshin (JP); Akira Ito, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 446 days.

(21) Appl. No.: 10/705,863

(22) Filed: Nov. 13, 2003

(65) Prior Publication Data

US 2004/0130667 A1 Jul. 8, 2004

(30) Foreign Application Priority Data

Nov. 20, 2002 (JP) .............................. 2002-336424

(51) Int. Cl.
*H04B 1/18* (2006.01)
*H03H 7/38* (2006.01)

(52) U.S. Cl. .................. 455/193.1; 455/193.2; 455/188.2; 455/285; 455/289; 333/124; 333/132

(58) Field of Classification Search ............. 455/193.1, 455/193.2, 193.3, 199.1, 179.1, 180.2, 188.1, 455/188.2, 191.2, 191.3, 269, 275, 285–291, 455/339, 340; 333/124, 129, 132, 32, 172, 333/174, 227, 231
See application file for complete search history.

(56) References Cited

U.S. PATENT DOCUMENTS

| 4,153,887 | A | * | 5/1979 | Poppa .......................... 333/172 |
| 4,596,044 | A | * | 6/1986 | Aoki et al. ................ 455/189.1 |
| 4,607,391 | A | * | 8/1986 | Matsuda .................. 455/188.2 |
| 4,731,877 | A | * | 3/1988 | Moon .......................... 455/340 |
| 5,054,117 | A | * | 10/1991 | Cruz et al. ................ 455/188.2 |
| 5,463,362 | A | * | 10/1995 | Kitaguchi ..................... 334/47 |
| 5,917,387 | A | * | 6/1999 | Rice et al. ................... 333/174 |
| 5,978,663 | A | * | 11/1999 | Yamamoto ............... 455/193.2 |
| 6,329,886 | B1 | | 12/2001 | Ogoro .......................... 333/32 |
| 6,472,953 | B1 | * | 10/2002 | Sakuragawa et al. ....... 333/133 |
| 6,864,924 | B1 | * | 3/2005 | Yamamoto .................. 348/731 |
| 6,903,783 | B1 | * | 6/2005 | Yamamoto .................. 348/731 |
| 6,933,984 | B1 | * | 8/2005 | Yamamoto et al. ......... 348/731 |
| 2002/0034934 | A1 | | 3/2002 | Watanabe et al. ........... 455/318 |

FOREIGN PATENT DOCUMENTS

| EP | 0 459 440 | | 12/1991 |
| EP | 0829918 A2 | * | 8/1997 |
| JP | 354104219 A | * | 8/1979 |
| JP | 2001-526483 | | 12/2001 |
| JP | 2001359005 A | * | 12/2001 |
| JP | 2002-176329 | | 6/2002 |
| WO | 99/30417 | | 6/1999 |

* cited by examiner

*Primary Examiner*—Duc M. Nguyen
(74) *Attorney, Agent, or Firm*—Wenderoth, Lind & Ponack, L.L.P.

(57) ABSTRACT

A matching unit includes a switching means for switching an inductance of a first inductor. This switching means sets an inductance such that a first inductor shows an inductance property to both of the VHF low-band and high-band, and shows a capacitance property to the UHF band. This structure allows the matching unit to achieve the matching for both the VHF low-band and high-band by just switching the two circuits of the VHF low-band and high-band, also allows the matching unit to show a capacitance property to the UHF band. Thus the loss produced in transmitting signals can be reduced, and the circuit can be simplified. As a result, the matching unit can be downsized, and the cost can be reduced.

15 Claims, 7 Drawing Sheets

MATCHING UNIT

FIELD OF THE INVENTION

The present invention relates to matching units to be used for receiving television broadcasts.

BACKGROUND OF THE INVENTION

A conventional matching unit is described hereinafter with reference to FIG. 12, which shows a block diagram of the conventional matching unit. High frequency signals ranging between from ca. 500 MHz to 900 MHz input to Antenna 1 for receiving signals of both the VHF and the UHF bands. An output from antenna 1 is fed into matching unit 12 having input terminal 2 and output terminal 3, and an output signal supplied from output terminal 3 is fed into electronic tuner 4. Tuner 4 selects the signal of a desirable channel and converts the signal into the given intermediate frequency (IF) signal, then outputs the signal from output terminal 5.

Between input terminal 2 and output terminal 3 of matching unit 12, a first series connecting unit formed of first switch 6 and low pass filter (LPF) 7 is interposed. A second series connecting unit formed of second switch 8 and band-pass filter (BPF) 9, and a third series connecting unit formed of third switch 10 and high pass filer (HPF) 11 are disposed in parallel with the first series connecting unit. A cutoff frequency of LPF 7 is approx. equal to the highest frequency among the channels of the VHF low-band (90–108 MHz in Japan, and 55 MHz–88 MHz in the USA). The frequencies of the VHF high-band.(170–222 MHz in Japan, and 170–216 MHz in the USA) pass through BPF 9. A cutoff frequency of HPF 11 is approx. equal to the lowest frequency among the UHF channels (470–770 MHz in Japan, and 470–806 MHz in the USA).

In the case of receiving a channel of the VHF low band, the matching unit turns on only first switch 6, so that the signal is supplied to LPF 7. As a result, the signals having frequencies over the VHF high band are attenuated. Further, in the case of receiving a channel of the UHF band, only third switch 10 is turned on, so that the signal is supplied to HPF 11, and the frequencies lower than the UHF band are attenuated. Those filter circuits provide each one of the frequencies input thereto with impedance matching between the antenna and the tuner.

However, the conventional matching unit is equipped with filters which carry out the impedance matching to respective frequency-bands, so that the circuit of the matching unit becomes complicated and bulky.

SUMMARY OF THE INVENTION

The present invention addresses the problem discussed above, and aims to provide a downsized matching unit. To achieve this object, the matching unit of the present invention comprises the following elements:
- a capacitor coupled between an input terminal and an output terminals;
- a first inductor coupled between the capacitor and a grounding;
- a second inductor coupled between an output terminal of the capacitor and the grounding; and
- a switching means for switching a low-band of the VHF band to/from a high-band of the VHF band.

The switching means switches at least a value of the first inductor, and the first inductor works as an inductance in both of the low-band and the high-band of the VHF band, and also works as a capacitance in the UHF band.

The structure discussed above allows the matching unit to provide the low-band and the high-band of VHF band with impedance matching respectively by only switching the two circuits, i.e., the low-band to/from the high-band of VHF band. This structure also allows the matching unit to work as a capacitance with respect to the UHF band, so that signals can be transmitted with little loss. As a result, the matching unit can be downsized with a simpler circuit at a lower cost.

Additional objects and advantages of the present invention will be apparent from the following detailed description of preferred embodiments thereof, which are best understood with reference to the accompanying drawings.

DESCRIPTION OF THE INVENTION

Exemplary Embodiment 1

Figure 1:
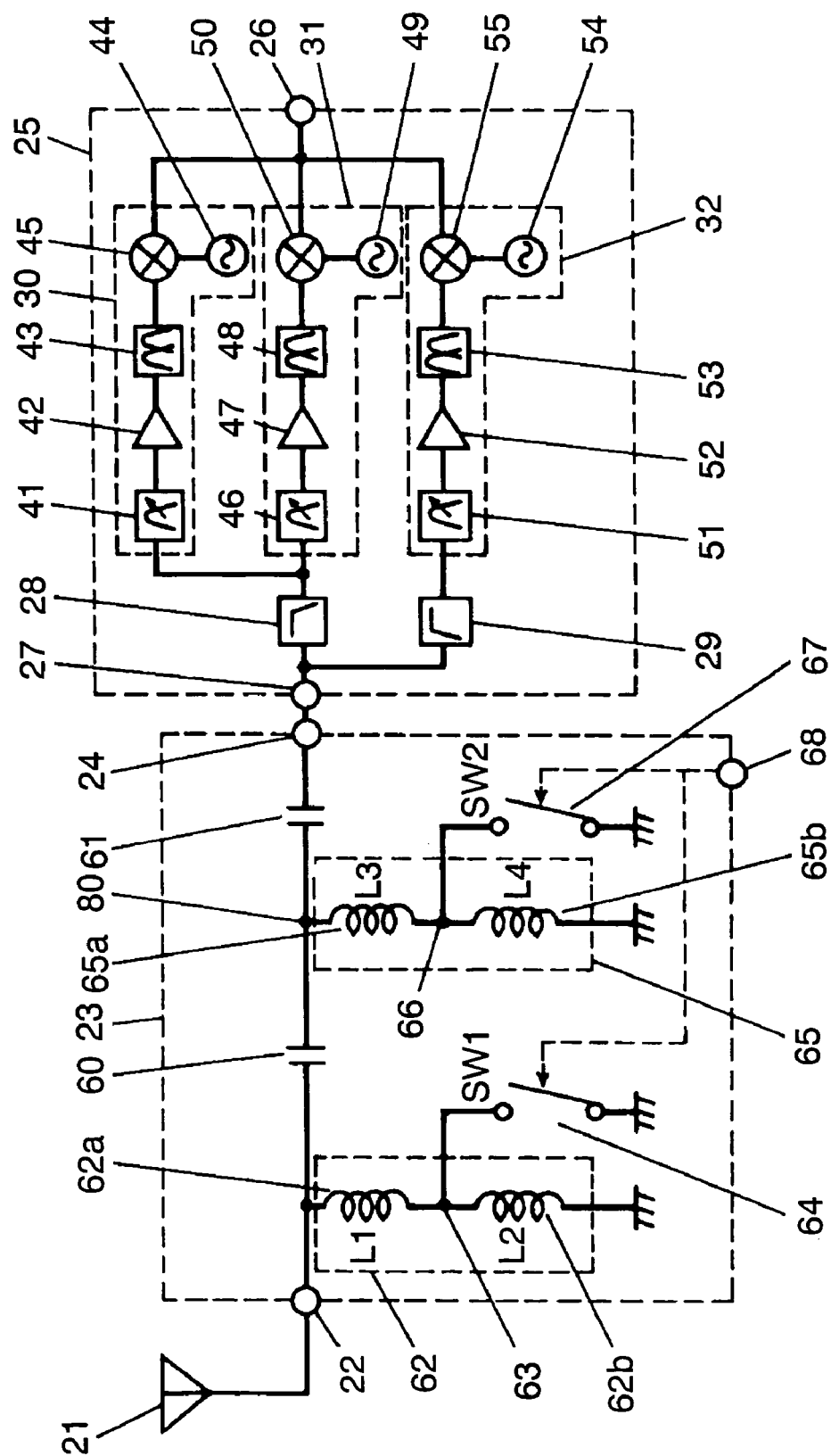
FIG. 1 is a block diagram of a matching unit in accordance with a first exemplary embodiment of the present invention.

The first embodiment is demonstrated hereinafter with reference to accompanying drawings. FIG. 1 is a block diagram of a matching unit in accordance with the first exemplary embodiment of the present invention. Rod antenna 21 receives television broadcasting waves ranging from ca. 50 MHz to 900 MHz and has a length of ca. 40 mm. Since antenna 21 is made of brass, resistance of antenna is small and loss in high-frequency signal is also small, so that an antenna having excellent receiving-sensitivity is obtainable.

Matching unit 23 includes input terminal 22 that is connected to antenna 21, and output terminal 24 that is connected to electronic tuner 25. Tuner 25 selects a desirable channel and converts the signal into the intermediate frequency (IF) signal (58.75 MHz in Japan, and 45.75 MHz in the USA) before outputting the IF signal from output terminal 26 of the tuner.

Next, electronic tuner 25 is detailed. Tuner 25 receives signals of both the VHF and the UHF bands, and includes input terminal 27 connected to output terminal 24 of matching unit 23. Input terminal 27 is coupled to low-pass filter (LPF) 28 attenuating signals of UHF band and to high-pass filter (HPF) 29 attenuating signals of the VHF band. A first output from LPF 28 is supplied to receiver 30 which receives signals of the VHF low-band, and a second output from LPF 28 is supplied to receiver 31 which receives signals of the VHF high-band. An output from HPF 29 is supplied to receiver 32 which receives signals of UHF band. Respective outputs from receivers 30, 31 and 32 are sent to output terminal 26 of the tuner.

Receiver 30 for the VHF low-band signals comprises the following elements:

single-tuning filter 41 formed of one tuning circuit;

high-frequency amplifier 42 for receiving an output from filter 41;

multiple-tuning filter 43 formed of two tuning circuits and receiving an output from amplifier 42; and first mixer 45 of which first input terminal receives an output from filter 43 and of which second input terminal receives an output from first local oscillator 44.

Receiver 31 for the VHF high-band signals and receiver 32 for the UHF band signals have structures similar to the foregoing structure of receiver 30. First, in the case of receiver 31, single-tuning filter 46, high-frequency amplifier 47, multiple-tuning filter 48, second local oscillator 49 and second mixer 50 are coupled in this order. In the case of receiver 32 for the UHF band, single-tuning filter 51, high-frequency amplifier 52, multiple-tuning filter 53, third local oscillator 54 and third mixer 55 are coupled in this order.

Next, matching unit 23 is detailed hereinafter. Input terminal 22 of matching unit 23 is coupled with first capacitor 60. Between first capacitor 60 and output terminal 24 of matching unit 23, second capacitor 61 is interposed, and second inductor 65 is interposed between the ground and junction point 80 of first and second capacitors 60 and 61.

First inductor 62 is formed of inductor 62a and inductor 62b coupled in series with each other, and inductor 62a is disposed on input terminal 22 side. Between junction point 63 of inductor 62a and inductor 62b, first switch (SW1) 64 is interposed. Second inductor 65 is formed of inductor 65a and inductor 65b coupled in series with each other, and inductor 65a is disposed on first-capacitor 60 side. Second switch (SW2) 67 is interposed between junction point 66 of inductor 65a and inductor 65b, and the grounding. First and second switches 64 and 67 are coupled to control terminal 68 disposed in matching unit 23, and the two switches can be turned on or off synchronizing with each other. In this first embodiment, first switch 64 and second switch 67 are used as an instance of the switching means.

Figure 2A:
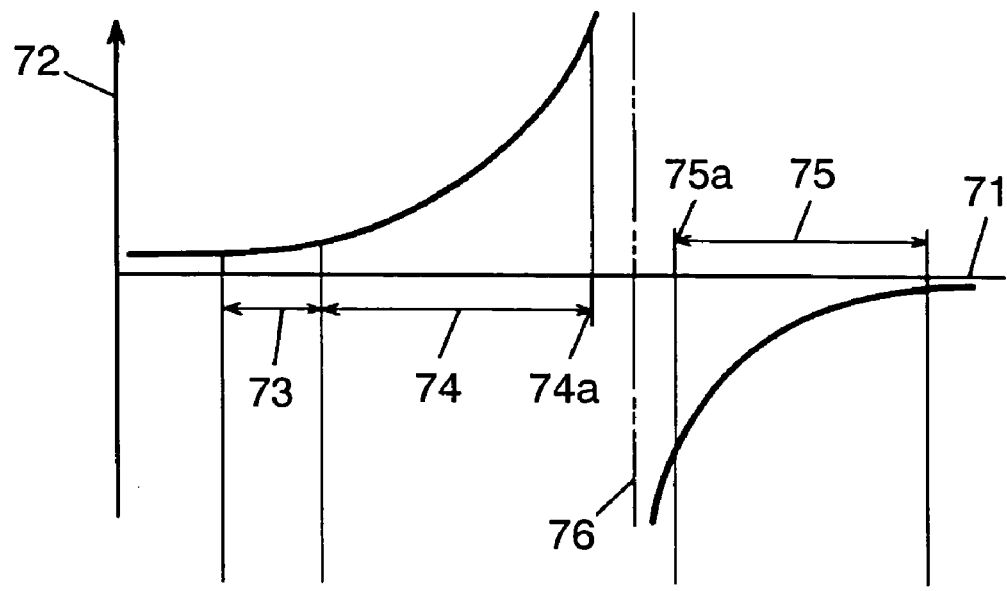
FIGS. 2A and 2B show reactance characteristics of a third and a fourth inductors used in the first exemplary embodiment of the present invention.
Figure 2B:
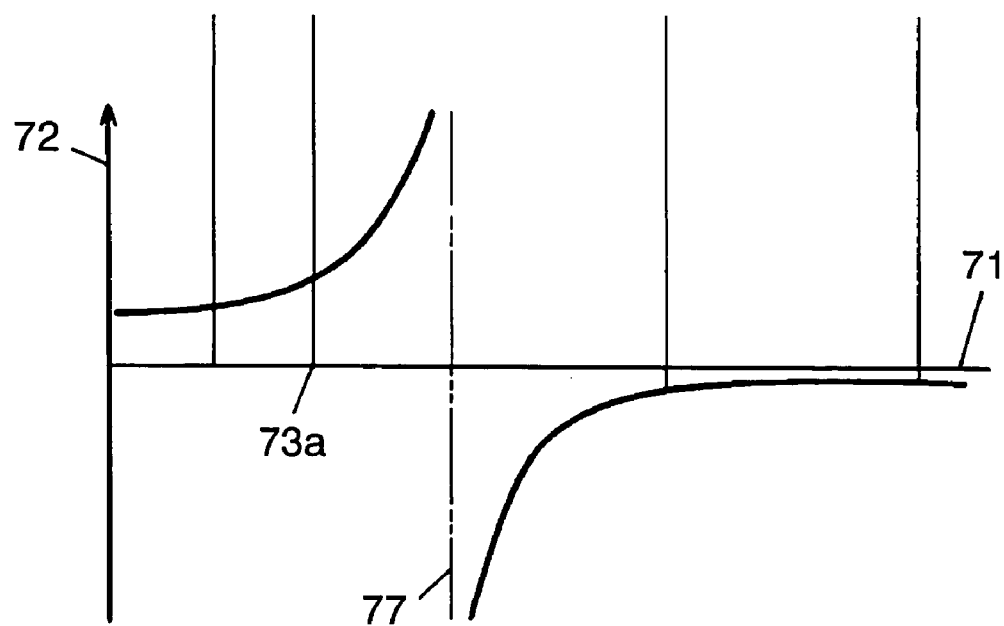

FIGS. 2A and 2B show schematically reactance-characteristics of the inductors used in this first embodiment. FIG. 2A shows the reactance characteristics of inductor 62a or 65a, and FIG. 2B shows that of inductor 62b or 65b. In those drawings, lateral axis 71 represents frequencies and vertical axis 72 represents reactance. The positive direction of vertical axis 72 shows an inductance property, and the negative direction shows a capacitance property.

FIG. 2A tells that inductors 62a and 65a show the inductance property to VHF low-band 73 and VHF high-band 74, and on the other hand they show the capacitance property to UHF band 75. In other words, those phenomena can be achieved by setting self-resonating frequencies 76 of inductors 62a and 65a between the highest frequency 74a (hereinafter referred to as high-end of VHF high) of the VHF high-band and the lowest frequency 75a (hereinafter referred to as low-end of UHF band) of the UHF band 75.

On the other hand, FIG. 2B tells that inductors 62b and 65b show the inductance property to VHF low band 73, and show the capacitance property to UHF band 75. In other words, those phenomena can be achieved by setting self-resonating frequencies 77 of inductors 62b and 65b between the highest frequency 73a (hereinafter referred to as high-end of VHF low) of the VHF low-band and low-end 75a of UHF band. Table 1 provides a summary of the relations between the receiving frequencies and the respective inductors.

TABLE 1

| band frequency | VHF low-band 90 MHz–108 MHz | VHF high-band 170 MHz–222 MHz | UHF band 470 MHz–770 MHz |
|---|---|---|---|
| L1 | inductance | inductance | capacitance |
| L2 | inductance | inductance or capacitance | capacitance |
| L3 | inductance | inductance | capacitance |
| L4 | inductance | inductance or capacitance | capacitance |

Figure 3:
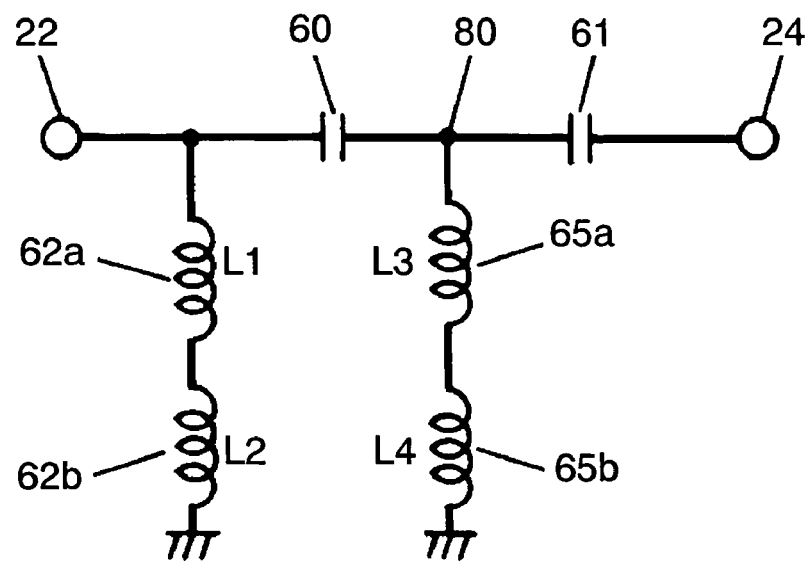
FIG. 3 shows an equivalent circuit diagram in receiving the VHF low-band in accordance with the first exemplary embodiment of the present invention.
Figure 4:
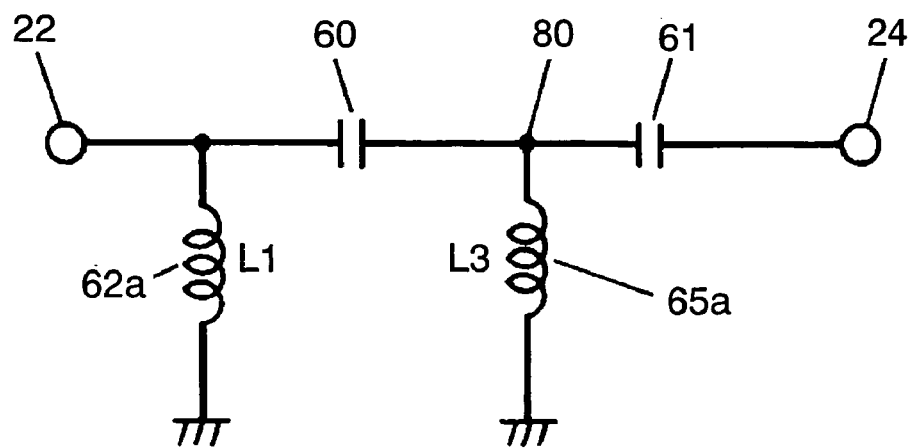
FIG. 4 shows an equivalent circuit diagram in receiving the VHF high-band in accordance with the first exemplary embodiment of the present invention.
Figure 5:
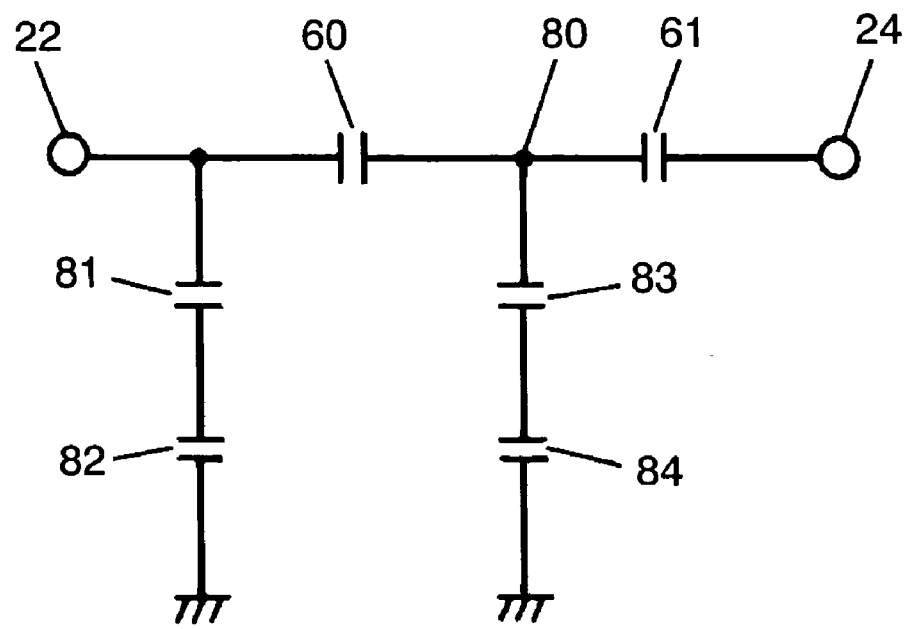
FIG. 5 shows an equivalent circuit diagram in receiving the UHF in accordance with the first exemplary embodiment of the present invention.

An operation of the foregoing matching unit in receiving signals is demonstrated hereinafter. FIG. 3 through FIG. 5 show equivalent circuit diagrams of the matching unit. The circuit shown in FIG. 3 is used when the matching unit receives signals in the VHF low-band, that shown in FIG. 4 is used when the unit receives signals in the VHF high-band, and that in FIG. 5 is used when the unit receives signals in the UHF band.

As TABLE 2 below shows, when matching unit 23 receives the VHF low-band, first switch (SW1) 64 and second switch (SW2) 67 are both turned off, and when receiving the VHF high-band, SW1 and SW2 are both turned on. When receiving the UHF band, SW1 and SW2 can be both turned on or turned off.

TABLE 2

| band frequency | VHF low-band 90 MHz–108 MHz | VHF high-band 170 MHz–222 MHz | UHF band 470 MHz–770 MHz |
|---|---|---|---|
| SW1 & SW2 | both turned off | both turned on | both turned on or turned off |

In this first embodiment, when the matching unit receives the UHF band, both SW1 and SW2 are set to be turned off.

First, the case of receiving the VHF low-band is demonstrated with reference to FIG. 3. In this case, first switch 64 and second switch 67 are both turned off, so that the series connecting unit formed of inductors 62a and 62b is interposed between input terminal 22 and the grounding as shown in FIG. 3. Another series connecting unit formed of inductors 65a and 65b is interposed between the grounding and junction point 80 of first capacitor 60 and second capacitor 61. Since the respective inductors are coupled in series, the composite inductance becomes greater, thereby achieving the match to low frequencies of the VHF low-band.

Next, the case of receiving the VHF high-band is demonstrated with reference to FIG. 4. In this case, first switch 64 and second switch 67 are both turned on, so that inductor 62a is connected directly to the grounding at its inductor 62b side, and inductor 65a is connected directly to the grounding at its inductor 65b side. As a result, only inductor 62a is interposed between input terminal 22 and the grounding, and only inductor 65a is interposed between the grounding and junction point 80, as shown in FIG. 4. Thus the inductance becomes smaller, thereby achieving the match to high frequencies of the VHF high-band.

Figure 6:
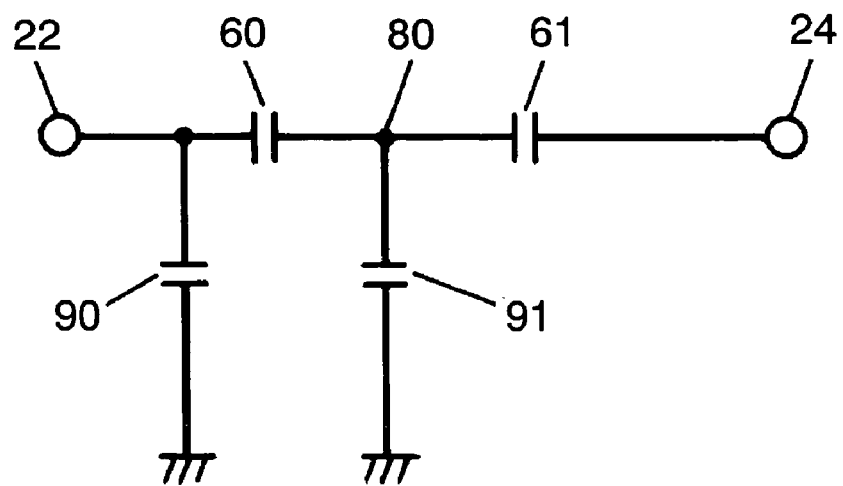
FIG. 6 shows another equivalent circuit diagram in receiving the UHF in accordance with the first exemplary embodiment of the present invention.

Last, the case of receiving the signals of UHF band is demonstrated with reference to FIGS. 5 and 6. FIG. 5 shows the equivalent circuit diagram in this case with switches 64 and 67 turned off, and FIG. 6 shows the equivalent circuit diagram also in this case with switches 64 and 67 turned on. As previously discussed in FIG. 2, all the inductors show the capacitance property with respect to the signals in the UHF band. Thus as shown in FIGS. 5 and 6, the capacitance property is interposed respectively between input terminal 22 and grounding, and also between junction point 80 and the grounding when the signals in the UHF band are received. Receiving the signals of the UHF band, matching unit 23 can be thus handled as formed of only capacitance components. In this first embodiment, matching unit 23 is set to receive the signals of the UHF band with switches 64 and 67 turned off. In this case, according to the foregoing demonstration, a series connecting unit formed of capacitance component 81 caused by inductor 62a and capacitance component 82 caused by inductor 62b is interposed between input terminal 22 and the grounding. Another series connecting unit formed of capacitance component 83 caused by inductor 65a and capacitance component 84 caused by inductor 65b is interposed between junction point 80 and the grounding. In this case, self-resonance frequency 76 of inductors 62a and 65a, and self-resonance frequency 77 of inductors 62b and 65b can be both interposed between high-end 73a of VHF low and low-end 75a of UHF.

Matching unit 23 can receive the signals of UHF band with switches 64 and 67 turned on. In this case, as shown in FIG. 6, capacitance component 90 due to inductor 62a is interposed between input terminal 22 and the grounding, and capacitance component 91 due to inductor 65a is interposed between junction point 80 and the grounding. Self-resonance frequency 76 of inductors 62a and 65a can be interposed between high-end 74a of VHF high and low-end 75a of UHF band. In either case, it is important to prevent the self-resonance frequency of the inductor, through which the signal passes, from entering into the frequency-band to be received.

In general, it is easier for a high-frequency signal to pass through a capacitance element at the higher frequency. In particular, a signal having a high frequency like in the UHF band can easily pass a capacitance element, so that the capacitance component of the respective inductors in the UHF band are preferably as small as possible. However, in the case of receiving signals in UHF band with switches 64 and 67 turned on, the resonance frequency of the inductor should be set between high-end 74a of VHF high and low-end 75a of UHF. This requirement obliges the capacitance component to become large, so that signals of lower frequencies in the UHF band tend to incur greater loss.

In this first embodiment, therefore, when switches 64 and 67 are both turned off, the matching unit is set to receive signals of the UHF band. According to this structure, when the UHF signals are received, the series connecting unit formed of capacitance 81 and capacitance 82 is interposed between input terminal 22 and the grounding. Another series connecting unit formed of capacitance 83 and capacitance 84 is interposed between junction point 80 and the grounding. In other words, capacitance 81 and capacitance 82 are connected in series, and capacitance 83 and capacitance 84 are connected in series, so that the equivalent capacitance becomes smaller, which reduces the loss of UHF signals. Further, since the resonance frequency of the inductor can be between high-end 73a of VHF low and low-end 75a of UHF band, the allowable range for the resonance frequency is so wide that a wider selection is available for the inductor to achieve the matching.

In this first embodiment, because a difference between the high-end of VHF high and the low-end of the UHF band is small, the matching unit is set to receive the signals of the UHF band when switches 64 and 67 are both turned off. However, if the difference between the high-end of VHF high and the low-end of the UHF band is greater, e.g., in a country or a region where no broadcasting is available around the high-end of VHF high and the low-end of the UHF band, the UHF signals can be received with switches 64 and 67 both turned on.

Figure 7:
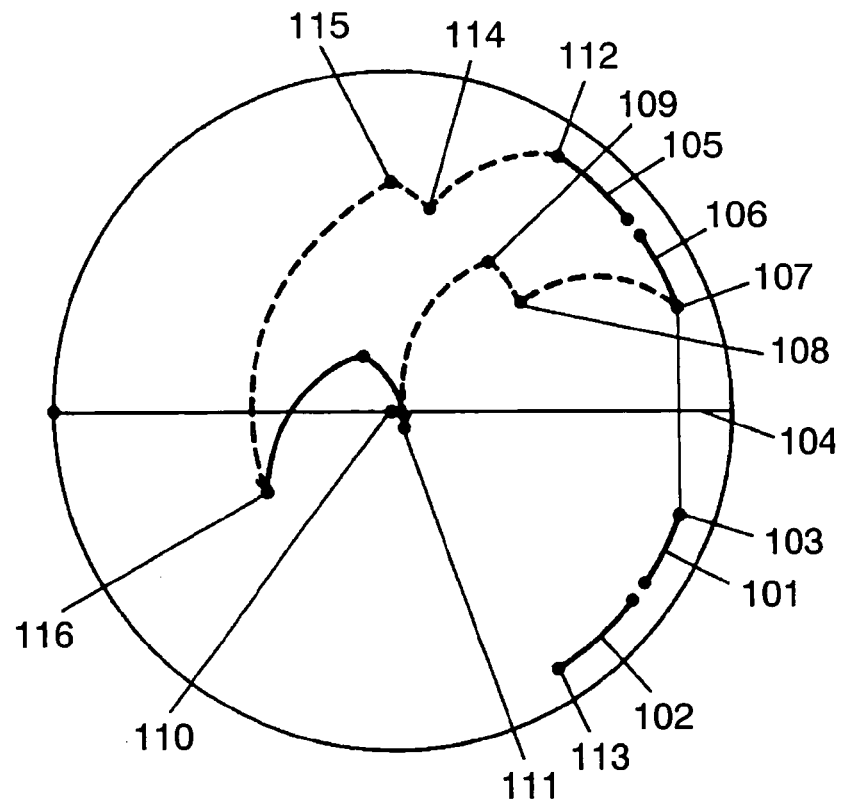
FIG. 7 shows a Smith chart of an antenna and the matching unit in receiving VHF in accordance with the first exemplary embodiment of the present invention.
Figure 8:
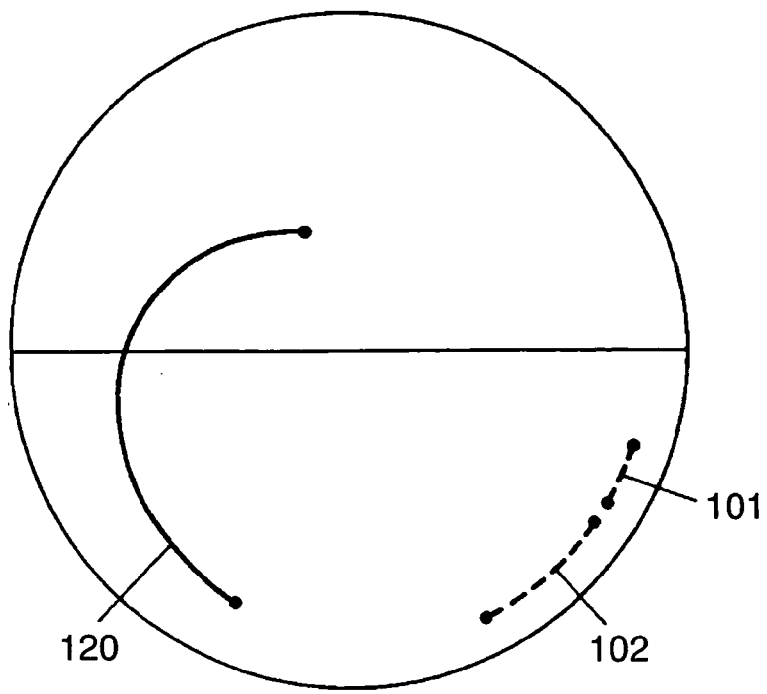
FIG. 8 shows a Smith chart of the antenna and the matching unit in receiving the UHF in accordance with the first exemplary embodiment of the present invention.

An operation of the matching unit having the foregoing structure is demonstrated hereinafter with reference to FIGS. 7 and 8. FIG. 7 shows a Smith chart of the antenna and the matching unit in receiving VHF, and FIG. 8 shows a Smith chart of the antenna and the matching unit in receiving the UHF. Both the charts show an inductor property at the upper half of the circle, and a capacitance property at the lower half of the circle. A center point of the circle shows an impedance of a device to be coupled to the lower side of matching unit 23. Tuner 25 used in this first embodiment has an impedance of 75 ohm in general, so that the center point of FIG. 7 is set at 75 ohm.

FIG. 7 shows impedance 101 of antenna 21 to the VHF low-band, and impedance 102 of antenna 21 to the VHF high-band. Antenna 21 is a rod antenna of 40 mm long, thus its electric length is so short than $\lambda/4$ of a receiving signal that impedance 101 and 102 becomes extremely small. For instance, a frequency of the highest channel in the VHF high-band has a wavelength of 1300 mm, so that the electric length of antenna 21 is shorter than $\lambda/4$, and impedance 102 is small. A frequency of the lowest channel in the VHF low-band has a wavelength of 3330 mm, so that the impedance becomes smaller. As shown in FIG. 7, impedance 103 at the lowest frequency in the VHF band is extremely small.

On the other hand, electronic tuner 25 receives, in general, an input of 75 ohm. Thus if antenna 21 is directly coupled with tuner 25, the impedance in between does not match, which results in attenuating the signal. The present invention then employs capacitors 60, 61 and inductors 62a, 62b, 65a, 65b as impedance matching elements. Those elements are used to adjust the impedance between devices, having unmatched impedance, such as antenna 21 and tuner 25.

For this reason, impedance on the input side of matching unit 23 and an impedance of antenna 21 are prepared to generally match with each other. In this case, the impedance of matching unit 23 needs to be matched in a complex number range of the impedance of antenna 21. In other words, the impedance on the input side of matching unit 23 is set at a value generally symmetrical about axis 104 to impedance 101 and impedance 102 of antenna 21. Thus, first of all, as shown in FIG. 7, inductor 62a is determined at a value such that impedance 105 of matching unit 23 in receiving the VHF high-band can match with impedance 102 of antenna 21. Next, inductor 62b is determined at a value such that impedance 106 of matching unit 23 in receiving the VHF low-band can match with impedance 101 of antenna 21. Then first capacitor 60, second capacitor 61 and inductors 65a, 65b are set appropriately such that an impedance at the output terminal becomes closer to approx. 75 ohm (center point of FIG. 7) with respect to the frequencies of VHF low-band and VHF high-band.

However, since antenna 21 has its own feeble resistance value, antenna 21 generates impedance due to this resistance. Thus in the case of matching the impedance between antenna 21 and matching unit 23, it is preferable to prepare an impedance due to resistance of matching unit 23 to be generally equal to the impedance due to the resistance of antenna 21. This preparation leads to another preparation as follows: A resistance value due to feeble resistant components owned by the inductor per se, which forms inductors 62a and 62b, is prepared to be generally equal to the resistance owned by antenna 21 per se. In this case, the factors such as types and numbers of elements to be used as inductors 62a and 62b and a circuit formed of those elements are selected appropriately so that the resistance of matching unit 23 can be determined.

A change in impedance caused by the respective elements of matching unit 23 is described as an instance in the case of receiving the low-end of VHF low and the high-end of VHF high. First, in the case of the low-end of VHF low, inductance 62a and inductance 62b form the composite inductance which shows impedance 107, which is then changed to impedance 108 by capacitor 60. Inductance 65a and inductance 65b form another composite inductance, which changes impedance 108 to impedance 109, which is finally changed to impedance 111 close to center point 110 (75 ohm) by capacitor 61.

Next, in the case of receiving the VHF high-band, since only inductor 62a is interposed between input terminal 22 and the grounding, the inductance becomes smaller than that in the case of receiving the VHF low-band. Thus in the case of receiving the high-end of VHF high, the impedance on the input side is impedance 112, which is generally matched with impedance 113 of antenna 21 in receiving the high-end of VHF high. Impedance 112 is changed to impedance 114 by capacitor 60, and then changed to impedance 115 by inductor 65a, and finally, impedance 115 is changed to impedance 116 close to center point 110 (75 ohm).

In the last place, the case of receiving the UHF band is described with reference to FIG. 8, which shows impedance 120 of antenna 21 in receiving the signals of the UHF band. Around the high-end of UHF band, the electric length of antenna 21 becomes close to λ/4, so that the impedance of antenna 21 shows an inductance property. Since the respective inductors of matching unit 23 show a capacitance property in receiving the UHF signals, it is easier to bring the impedance of matching unit 23 close to the complex number range of the impedance of antenna 21.

Around the low-end of UHF band, impedance of both antenna 21 and matching unit 23 show the capacitance property, thus the matching between them cannot be expected. However, since impedance caused by a capacitor is inversely proportional to the frequency, matching unit 23 has a smaller impedance to higher frequencies such as the UHF band because the impedance of matching unit 23 is formed of only the capacitance property. As a result, smaller loss in the signals can be expected.

In this first embodiment, inductor 62a takes a value of 82 nH, inductor 62b takes 440 nH, inductor 65a takes 120 nH, and inductor 65b takes 330 nH. Assume that capacitor 60 takes 2 pF and capacitor 61 takes 6 pF, then matching unit 23 can achieve the matching for both VHF low-band and VHF high-band, and smaller loss in the UHF signals.

The foregoing structure allows matching unit 23 to match its impedance with that of antenna 21 for the respective bands as well as allows matching unit 23 to match its impedance with that of tuner 25. In other words, matching unit 23 achieves the matching with respect to either the VHF low-band or the VHF high-band by switching between the two circuits, and shows the capacitance property to the UHF band, so that signal loss in the respective bands can be reduced. As a result, matching unit 23 can transmit the signals of the respective bands to the electronic tuner free from loss with its very simple circuit, which reduces the cost and downsizes the matching unit per se.

Because matching unit 23 cannot achieve the matching for the VHF high-band signals while it receives the VHF low-band signals, it is difficult for the VHF high-band signals to pass through matching unit 23. On the contrary, matching unit 23 cannot achieve the matching for the VHF low-band signals while it receives the VHF high-band signals, so that it is difficult for the VHF low-band signals to pass through matching unit 23. This mechanism and the location of matching unit 23, i.e., it is placed before LPF 28 of tuner 25, allow moderating the attenuating characteristics of the input filters such as single tuning filters 41, 46 and multi-tuning filters 43, 48, 52. As a result, those input filters can be simplified, which reduces the cost of tuner 25 as well as receives the signals supplied from antenna 21 free from loss.

Matching unit 23 can achieve the matching if it is connected to an antenna of which length is shorter enough than ¼ wavelength, so that it can be used with a small size antenna. Further, switches 64 and 67 are placed on places other than signal lines, thus no signal loss is produced by those switches.

Exemplary Embodiment 2

Figure 9:
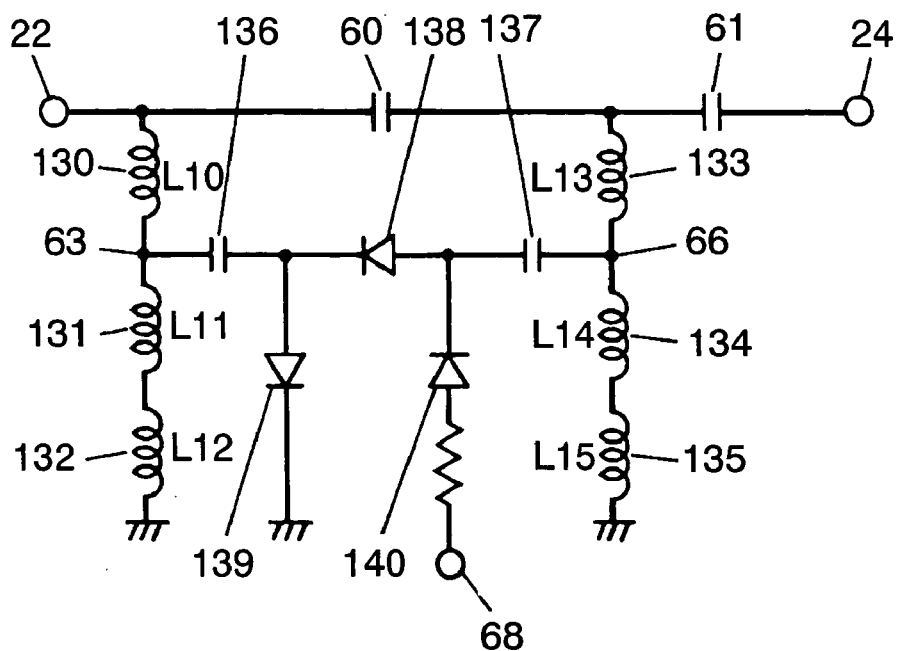
FIG. 9 shows a circuit diagram of a matching unit in accordance with a second exemplary embodiment of the present invention.
Figure 10:
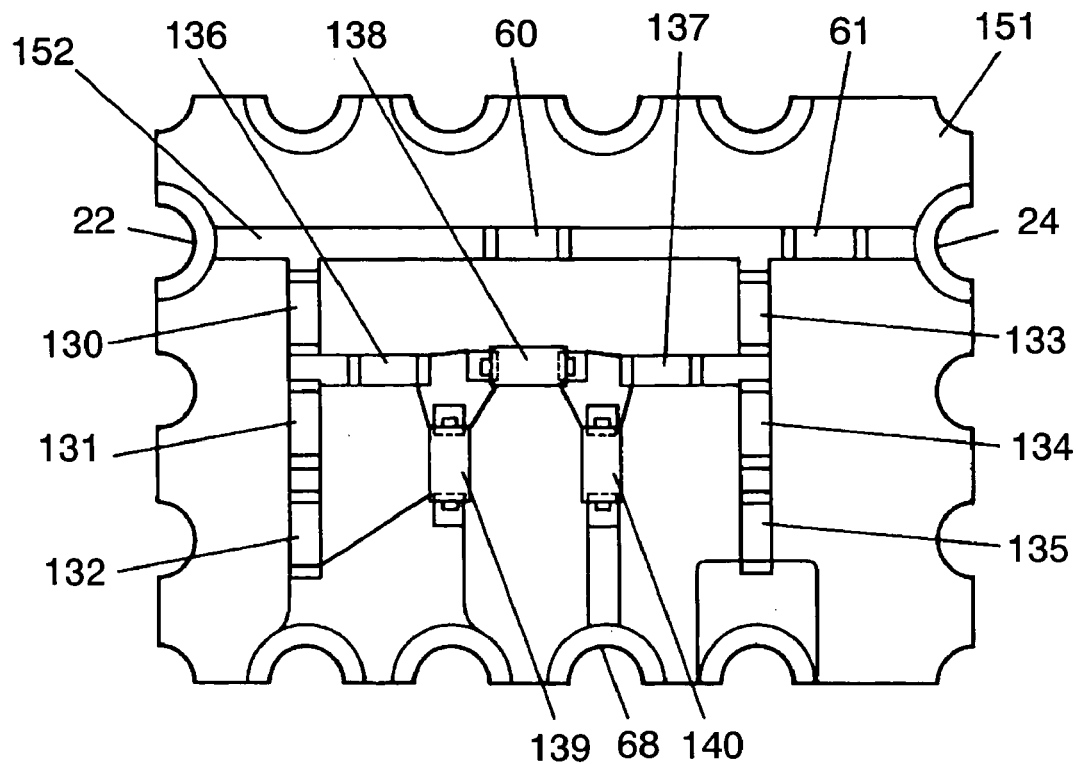
FIG. 10 shows a layout of components in accordance with the second exemplary embodiment of the present invention.
Figure 12:
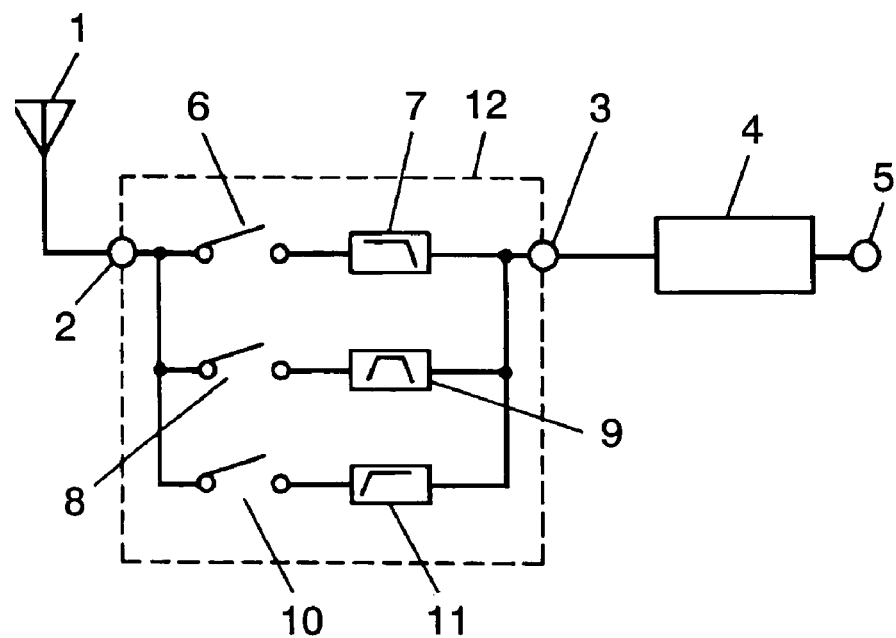
FIG. 12 is a block diagram of a conventional matching unit.

The second exemplary embodiment is demonstrated hereinafter with reference to accompanying drawings. FIG. 9 shows a circuit diagram of a matching unit in accordance with the second embodiment, and FIG. 10 shows a component layout of the matching unit. In those drawings, similar elements to those in FIG. 12 and FIG. 1 have the same reference marks, and the descriptions thereof are omitted. In FIG. 9, first inductor 62 is formed of a series connecting unit comprising inductors 130, 131 and 132, which are connected in series in this order from the input terminal 22. Second inductor 65 is formed of a series connecting unit comprising inductors 133, 134 and 135.

Switches 64 and 67 are formed of a circuit comprising three diodes. A series connecting unit formed of capacitors 136 and 137 is interposed between junction points 63 and 66, and diode 138 is interposed between those capacitors. The cathode of diode 138 is coupled with the anode of diode 139, and the cathode of diode 139 is coupled to the grounding. The anode of diode 138 is coupled to the cathode of third diode 140, of which anode is coupled to control terminal 68 via a resistor.

Capacitors 136 and 137 prevent a dc signal, namely, a control signal, from running into the input terminal or the output terminal. Further, diode 138 prevents a high-frequency signal from running between junction points 63 and 66 while diode 139 is turned off. Diode 140 prevents a high-frequency signal from running out from control terminal 68. In the case of receiving the VHF high-band signals, supply of 5V to control terminal 68 turns on diodes 138, 139 and 140. In the case of receiving the VHF low-band signals, supply of 0V to terminal 68 turns off diodes 138, 139 and 140.

Those foregoing circuits are formed of chip-components as shown in FIG. 10, and the chip-components are mounted to double-sided printed circuit board 151 by reflow-soldering method, so that the chip-components are connected with each other and fixed to board 151. Input terminal 22 and output terminal 24 of the matching unit, control terminal 68, and the grounding terminal are formed by through-hole terminals. Matching unit 23 is equipped with a cover (not shown), and legs of the cover are soldered with the grounding terminal, so that matching unit 23 is shielded.

In this second embodiment, capacitor 60 takes a value of 2 pF, and capacitor 61 takes 6 pF. The respective inductors are set at the constants shown in table 3 so that the matching can be achieved for both the VHF low-band and VHF high-band, and the loss in the UHF band signals can be reduced by this smaller size matching unit.

Table 3 lists the inductors actually measured with respect to 100 MHz (typically for VHF low-band), 200 MHz (typically for VHF high-band) and 500 MHz (typically for UHF band) respectively. Inductor (L10) 130 here should have shown normally a capacitance property to the UHF band; however, inductance 130 actually takes a value of 2380 nH to show an inductance property. This is because an optimum inductance with respect to both VHF low-band and high-band is selected to inductance 130, as a result, inductance 130 by itself shows the inductance property to the UHF band. In other words, the self-resonance frequency of inductance 130 falls within the frequencies of the UHF band.

TABLE 3

| No. | band frequency | 1 MHz | VHF low-band 100 MHz | VHF high-band 200 MHz | UHF band 500 MHz | |
|---|---|---|---|---|---|---|
| 130 | L10 | 82 | 83.5 | 94.4 | 2380 | L1 |
| 131 | L11 | 220 | 248.2 | 389.5 | −126 | L2 |
| 132 | L12 | 220 | 248.2 | 389.5 | −126 | |
| 133 | L13 | 120 | 127.4 | 155.6 | −248 | L3 |
| 134 | L14 | 150 | 164.3 | 215.2 | −171 | L4 |
| 135 | L15 | 180 | 189.2 | 260.8 | −150 | |

(unit: nH)

Therefore, in this second embodiment, inductor 130 is coupled, via solder, with a feeble inductance caused by board conductor 152. Thus a resonance frequency of the composite inductor formed of inductor 130 and board conductor 152 changes to the lower side, and shows a capacitance property to the UHF band. The feeble inductance due to board conductor 152 is so small that it influences only little to the frequencies of VHF band.

In short, there is not always an optimum constant that meets all the conditions, and if no optimum constant is available, a constant is selected such that the inductor shows a inductance property to the VHF frequencies, and an optimum matching is achievable for both the VHF high-band and low-band. In this status, when inductor 130 shows an inductance property to the UHF band frequencies, board conductor 152 can be appropriately selected so that inductor 130 can change to show a capacitance property.

The foregoing preparation allows an inductor constant actually used to show the capacitance property to the UHF frequencies with ease although the constant inherently shows no capacitance property to the frequencies in the UHF band. This means that a wider selection is available for an inductance constant to be used.

Since the respective inductors are reflow-soldered to the pattern of board 151, the self-alignment effect of the reflow-soldering facilitates the respective inductors to be positioned and soldered generally at predetermined spots accurately. Thus the feeble inductance formed by board conductor 152 becomes generally a predetermined value, so that the self-oscillating frequency of the first inductor can be stable. As a result, manufacturing quality of the matching unit can be stable.

Exemplary Embodiment 3

Figure 11:
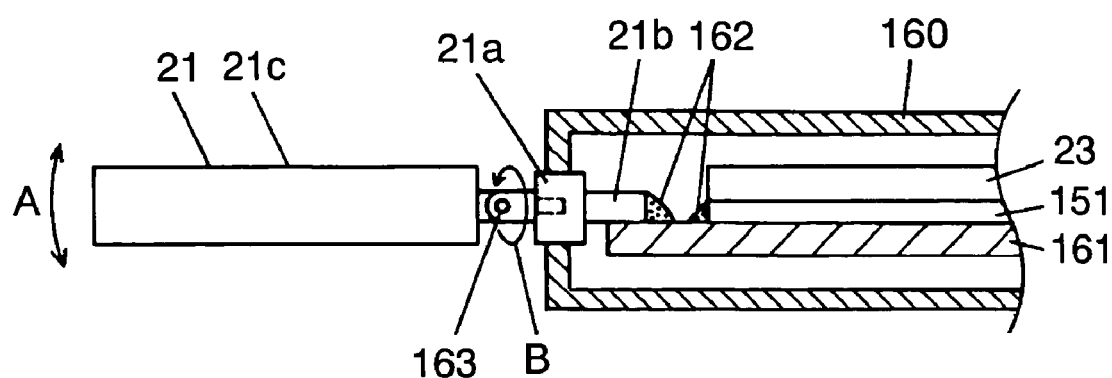
FIG. 11 illustrates a high-frequency receiver in accordance with a third exemplary embodiment and employing the matching unit used in the second embodiment.

The third exemplary embodiment is demonstrated hereinafter with reference to FIG. 11, which shows a sectional view of a high-frequency receiver in accordance with the third exemplary embodiment and employing the matching unit used in the second embodiment. In FIG. 11, fixing section 21a prepared at the end of antenna 21 is rigidly mounted to housing 160 of the high-frequency receiver. Tip 21b of antenna 21 is connected to printed circuit board 161 disposed in housing 160 with solder 162. Antenna 21 includes movable section 163 between its main body 21c and fixing section 21a. Movable section 163 is supported by a shaft such that it can rotate around two axes, namely, in both directions A and B. Board 161 has matching unit 23, and its input terminal is electrically connected to antenna 21 with solder 162.

The high-frequency receiver discussed above is capable to obtain an optimum sensitivity by moving antenna 21 around movable section 163, thereby compensating antenna 21 for a reduction in sensitivity caused by the directivity of antenna. However, movable section 163 has a contact resistance which produces feeble resistance to high-frequency signals. Thus a preparation is needed such that an impedance in movable section 163 caused by the contact resistance can be generally equal to an impedance of the resistant component in the circuit of matching unit 23. Then a matching with antenna 21 having little impedance is achievable with ease.

Use of the matching unit of the present invention in a small body and having a simplified circuit can downsize the high-frequency receiver. Further, the preparation discussed above allows using an antenna, of which electrical length is shorter enough than λ/4 of the receiving frequency, for achieving the matching with tuner 25. As a result, a small size antenna can be used with the matching unit.

It will be obvious to those skilled in the art that various changes may be made in the above-described embodiments of the present invention. However, the scope on the present invention should be determined by the following claims.

INDUSTRIAL APPLICABILITY

The present invention provides a matching unit that can achieve the matching both for the VHF low-band and the VHF high-band by just switching between the two circuits of the VHF low-band and the VHF high-band. The matching unit also shows a capacitance property to the UHF band, so that it can transmit the signals of the respective bands with little loss. As a result, the matching unit can be downsized and its cost can be reduced because of its simpler circuit.

Use of this matching unit before an input filter such as a tuner can simplify the input filter, so -that the cost of the tuner can be reduced and the signals received by the antenna can be efficiently supplied to the tuner.

Use of an antenna, of which length is shorter enough than ¼ wavelength, with the matching unit can achieve the matching, so that a small-size antenna can be used.

It will be obvious to those skilled in the art that various changes may be made in the above-described embodiments of the present invention. However, the scope on the present invention should be determined by the following claims.

What is claimed is:

1. A matching unit for receiving a first frequency band, a second frequency band higher than the first one, and a third frequency band higher than the second one, the matching unit comprising:
   an input terminal;
   an output terminal;
   a capacitor interposed between the input terminal and the output terminal;
   a first inductor interposed between an input of the capacitor and a grounding;
   a second inductor interposed between an output of the capacitor and a grounding; and
   a switching means for switching the first frequency band and the second frequency band;
   wherein the switching means switches an inductance of the first inductor, and
   wherein the first inductor shows an inductance property to the first and the second frequency-bands, and shows a capacitance property to the third frequency band.

2. The matching unit of claim 1, wherein the first frequency band is a VHF low-band, the second frequency band is a VHF high-band, and a third frequency band is a UHF band.

3. The matching unit of claim 1, wherein the first frequency band ranges from 90 MHz to 108 MHz, the second frequency band ranges from 170 MHz to 222 MHz, and the third frequency band ranges from 470 MHz to 770 MHz.

4. The matching unit of claim 1 further comprising a second switching means for switching a second inductor, which shows an inductance property to the first and the second frequency-bands, and shows a capacitance property to the third frequency band.

5. The matching unit of claim 4, wherein the first and the second switching means work synchronizing with each other.

6. The matching unit of claim 1, wherein the first inductor is a first series connecting inductor formed of a third inductor and a fourth inductor, and the first switching means switches a junction point of the third inductor and the fourth inductor for connecting an output of the third inductor to grounding.

7. The matching unit of claim 6, wherein the first switching means switches the inductance of the first inductor between the inductance of the third inductor and an inductance of the first series connecting inductor.

8. The matching unit of claim 6 further comprising a circuit board, wherein the third inductor and the fourth inductor are coupled with each other with a conductive pattern on the circuit board, and wherein the conductive pattern, the third inductor and the fourth inductor are coupled to each other with solder.

9. The matching unit of claim 6, wherein the third inductor and the conductive pattern coupled to the third inductor show a capacitance property to the third frequency band.

10. The matching unit of claim 6, wherein the first switching means sets a self-resonance point of the third inductor between the second frequency band and the third frequency band in receiving the second frequency band.

11. The matching unit of claim 6, wherein the first switching means sets a self-resonance point of the first series connecting inductor between the first frequency band and the third frequency band in receiving the first frequency band.

12. The matching unit of claim 1, wherein the second inductor is a second series connecting inductor comprising a fifth inductor and a sixth inductor, and the second switching means switches a junction point of the fifth inductor and the sixth inductor for connecting an output of the fifth inductor to a grounding.

13. The matching unit of claim 12 wherein the second switching means switches an inductance of the second inductor between an inductance of the fifth inductor and an inductance of the second series connecting inductor.

14. The matching unit of claim 1, further comprising an antenna having a resistance connected to the input terminal, wherein the resistance of said antenna is generally equal to a resistance viewed from the input terminal.

15. The matching unit of claim 1, for use with an antenna having a resistance to be connected to the input terminal of said matching unit, wherein a resistance viewed from the input terminal of said matching unit is generally equal to the resistance of the antenna.

* * * * *